(12) United States Patent
Monroe et al.

(10) Patent No.: US 11,266,038 B2
(45) Date of Patent: *Mar. 1, 2022

(54) SUPERCONDUCTING COMPUTING SYSTEM IN A LIQUID HYDROGEN ENVIRONMENT

(71) Applicant: Microsoft Technology Licensing, LLC, Redmond, WA (US)

(72) Inventors: Mark Monroe, Redmond, WA (US); Christian L. Belady, Mercer Island, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/999,217

(22) Filed: Aug. 21, 2020

(65) Prior Publication Data
US 2020/0396863 A1    Dec. 17, 2020

Related U.S. Application Data

(63) Continuation of application No. 16/443,444, filed on Jun. 17, 2019, now Pat. No. 10,785,891.

(51) Int. Cl.
*H05K 7/20* (2006.01)
*H01L 23/44* (2006.01)
(Continued)

(52) U.S. Cl.
CPC .......... *H05K 7/20236* (2013.01); *G06F 1/20* (2013.01); *H01L 23/445* (2013.01);
(Continued)

(58) Field of Classification Search
CPC .............. H05K 7/20236; H05K 7/203; H05K 7/30372; H05K 7/20772; H05K 7/20809;
(Continued)

(56) References Cited

U.S. PATENT DOCUMENTS 3,916,079 A * 10/1975 Kohler ................. H01F 6/065
                                                        174/15.3
4,662,181 A *  5/1987 Brigham .............. F17C 9/00
                                                        417/300
(Continued)

FOREIGN PATENT DOCUMENTS

JP       H01121915 A       5/1989
WO    WO-2017186336 A1 * 11/2017 ............... F17C 5/02

OTHER PUBLICATIONS

"International Search Report and Written Opinion Issued in PCT Application No. PCT/US20/031248", dated Feb. 23, 2021, 12 Pages.

*Primary Examiner* — Robert J Hoffberg
(74) *Attorney, Agent, or Firm* — Ranjeev Singh; Singh Law, PLLC

(57) ABSTRACT

Superconducting computing system housed in a liquid hydrogen environment and related aspects are described. An example superconducting computing system includes a housing, arranged inside a liquid hydrogen environment, where a lower pressure is maintained inside the housing than a pressure outside the housing. The superconducting computing system further includes a substrate, arranged inside the housing, having a surface, where a plurality of components attached to the surface is configured to provide at least one of a computing or a storage functionality, and the substrate further comprises a plurality of circuit traces for interconnecting at least a subset of the plurality of the components. The housing is configured such that each of the plurality of components is configured to operate at a first temperature, where the first temperature is below 4.2 Kelvin, despite the liquid hydrogen environment having a second temperature greater than 4.2 Kelvin.

18 Claims, 5 Drawing Sheets

(51) Int. Cl.
  *H05K 1/02*      (2006.01)
  *H05K 1/18*      (2006.01)
  *G06F 1/20*      (2006.01)

(52) U.S. Cl.
  CPC ........... *H05K 1/0203* (2013.01); *H05K 1/181* (2013.01); *H05K 7/20372* (2013.01); *H05K 7/20772* (2013.01); *F17C 2203/0366* (2013.01)

(58) Field of Classification Search
  CPC ........ H05K 1/0203; H05K 1/181; G06F 1/20; H01L 23/445; F17C 2203/0366
  See application file for complete search history.

(56) References Cited

U.S. PATENT DOCUMENTS

| | | | |
|---|---|---|---|
| 10,141,493 B2 * | 11/2018 | Tuckerman | H01B 12/02 |
| 10,165,667 B1 * | 12/2018 | Christiansen | G06F 1/20 |
| 10,785,891 B1 * | 9/2020 | Monroe | H05K 1/181 |
| 10,840,296 B2 * | 11/2020 | Rosenblatt | B82Y 10/00 |
| 2016/0237555 A1 * | 8/2016 | Mai | H01J 37/3435 |
| 2019/0137038 A1 * | 5/2019 | Reese | F17C 1/00 |

* cited by examiner

SUPERCONDUCTING COMPUTING SYSTEM IN A LIQUID HYDROGEN ENVIRONMENT

CROSS-REFERENCE TO RELATED APPLICATION(S)

This application is a continuation of U.S. patent application Ser. No. 16/443,444, filed on Jun. 17, 2019, entitled "SUPERCONDUCTING COMPUTING SYSTEM IN A LIQUID HYDROGEN ENVIRONMENT," now issued as U.S. Pat. No. 10,785,891, the entire contents of which are hereby incorporated herein by reference.

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems. As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors.

An additional approach to the use of processors and related components, based on CMOS technology, is the use of superconducting logic-based components and devices. Superconducting logic-based components and devices can also be used to process quantum information, such as qubits. But, even superconducting logic-based devices, such as superconducting memories, consume significant amount of power because of the need to operate at cryogenic temperatures (e.g., 4.2 K or below).

SUMMARY

In one aspect of the present disclosure, a superconducting computing system including a housing, arranged inside a liquid hydrogen environment, where a lower pressure is maintained inside the housing than a pressure outside the housing. The superconducting computing system may further include a substrate, arranged inside the housing, having a surface, where a plurality of components attached to the surface is configured to provide at least one of a computing or a storage functionality, and where the substrate further comprises a plurality of circuit traces for interconnecting at least a subset of the plurality of the components, where the housing is configured such that each of the plurality of components is configured to operate at a first temperature, where the first temperature is below 4.2 Kelvin, despite the liquid hydrogen environment having a second temperature greater than 4.2 Kelvin.

In another aspect of the present disclosure, a superconducting computing system including a housing, arranged inside a liquid hydrogen environment, where a lower pressure is maintained inside the housing than a pressure outside the housing, is provided. The superconducting computing system may further include a first substrate, inside the housing, arranged in a first plane having a first surface parallel to the first plane, where a first plurality of components, attached to the first surface, is configured to provide at least one of a computing or a storage functionality. The superconducting computing system may further include a second substrate, inside the housing, arranged in a second plane, parallel to the first plane, the second substrate having a second surface parallel to the second plane, where a second plurality of components, attached to the second surface, is configured to provide at least one of the computing functionality or the storage functionality, and where the first substrate further comprises a first plurality of circuit traces for interconnecting at least a subset of the first plurality of the components, and where the second substrate further comprises a second plurality of circuit traces for interconnecting at least a subset of the second plurality of the components, where liquid helium inside the housing is configured to cool the environment inside the housing such that each of the first plurality of components and the second plurality of components is configured to operate at a first temperature, where the first temperature is below 4.2 Kelvin, despite the liquid hydrogen environment having a second temperature greater than 4.2 Kelvin.

In yet another aspect, the present disclosure relates to a superconducting computing system including a first storage tank. The superconducting computing system may further include a second storage tank containing hydrogen in a liquified state, where the second storage tank is arranged inside the first storage tank. The superconducting computing system may further include a cryostat wall, arranged inside the second storage tank, where a vacuum is maintained inside a space enclosed by the cryostat wall. The superconducting computing system may further include a substrate, inside the cryostat wall, where a plurality of components, coupled to the substrate, is configured to provide at least one of a computing or a storage functionality. The superconducting computing system may further include a cooling system configured to maintain a temperature inside the housing below 4.2 Kelvin.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1A:
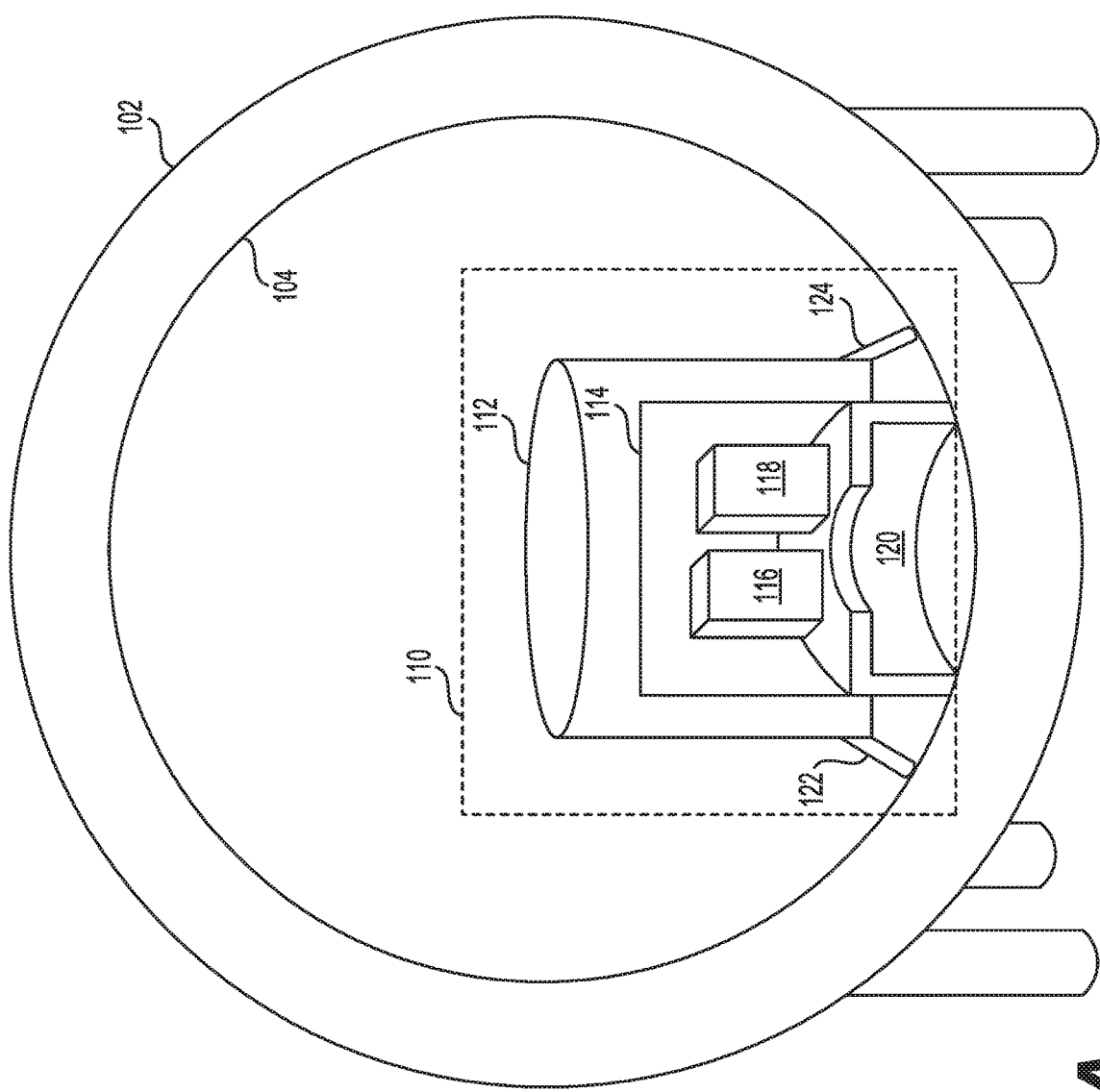
FIG. 1A shows a superconducting computing system inside a liquid hydrogen environment, in accordance with one example.

Examples described in this disclosure relate to computing systems that include superconducting components and devices. Certain examples of the present disclosure relate to a computing system comprising components operating at cryogenic temperatures (e.g., at or below 4.2 Kelvin). In one example, the superconducting system is housed in a vacuum assembly, which is enclosed in a liquid hydrogen environment. In this example, the superconducting system may include one or more superconducting components formed on a substrate. The superconducting component may include integrated circuit chips mounted on the substrate. Superconducting components and devices may use Josephson junctions to implement the functionality associated with a circuit. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the superconducting circuits. As an example, superconductors are materials that can carry a direct electrical current (DC) in the absence of an electric field. Superconductors have a critical temperature (Tc) below which they have zero resistance. Niobium, one such superconductor, has a critical temperature (Tc) of 9.3 Kelvin degrees. At temperatures below Tc, niobium is superconductive; however, at temperatures above Tc, it behaves as a normal metal with electrical resistance. Thus, in the SIS type of Josephson junction superconductors may be niobium superconductors and insulators may be $Al_2O_3$ barriers. In SIS type of junctions, the superconducting electrons are described by a quantum mechanical wave-function. A changing phase difference in time of the phase of the superconducting electron wave-function between the two superconductors corresponds to a potential difference between the two superconductors.

Various superconducting circuits including transmission lines can be formed by coupling multiple Josephson junctions by inductors or other components, as needed. Microwave pulses can travel via these transmission lines under the control of at least one clock. The microwave pulses can be positive or negative, or a combination thereof. The microwave pulses may have a frequency of up to 10 GHz or higher. Any circuit board or other type of structure, such as an interposer with such superconducting circuits may be required to support not only the, high-frequency microwave signals but also direct current (DC) signals.

Although there are several benefits of superconductivity, including lower resistance and better bandwidth characteristics, superconducting materials need to be operated at cryogenic temperatures (e.g., 4K). In a large-scale computing system that is data processing intensive, hundreds of megawatts of power may be required for the 4K environment. The present disclosure describes a computing system that may advantageously consume less power by limiting thermal parasitic effects by enclosing the cryo-computing environment inside a liquid hydrogen environment maintained at a temperature of approximately 20 Kelvin. In addition, the use of additional features that lower the thermal parasitic effects may further enhance the operational efficiency of such a system. The cryo-computing environment may be formed using conduction, convection, or immersion.

FIG. 1A is a view 100 of a superconducting computing system 110 inside a liquid hydrogen environment in accordance with one example. In this example, the liquid hydrogen environment may include a storage tank 102 that may include a liquid hydrogen container 104. Liquid hydrogen container 104 may include liquified hydrogen, which may be at a temperature between 20 Kelvin to 22 Kelvin, Additional details concerning an example liquid hydrogen environment are provided with respect to FIG. 4. Liquid hydrogen container 104 may include superconducting computing system 110. Superconducting computing system 110 may include a housing 112. Housing 112 may be configured to maintain a vacuum inside the housing. Components (e.g., processors and memory) corresponding to superconducting computing system 110 are located inside housing 112 that maintains vacuum. Housing 112 may include a thermal shield 114, which may further enclose superconducting components that may be arranged as part of two sets of superconducting components: a first superconducting component set 116 and a second superconducting component set 118. The superconducting components may be included in just one set or more sets. The superconducting components may be configured to operate in a cryogenic environment (e.g., in a vacuum and at a temperature below 4.2 Kelvin).

Figure 1B:
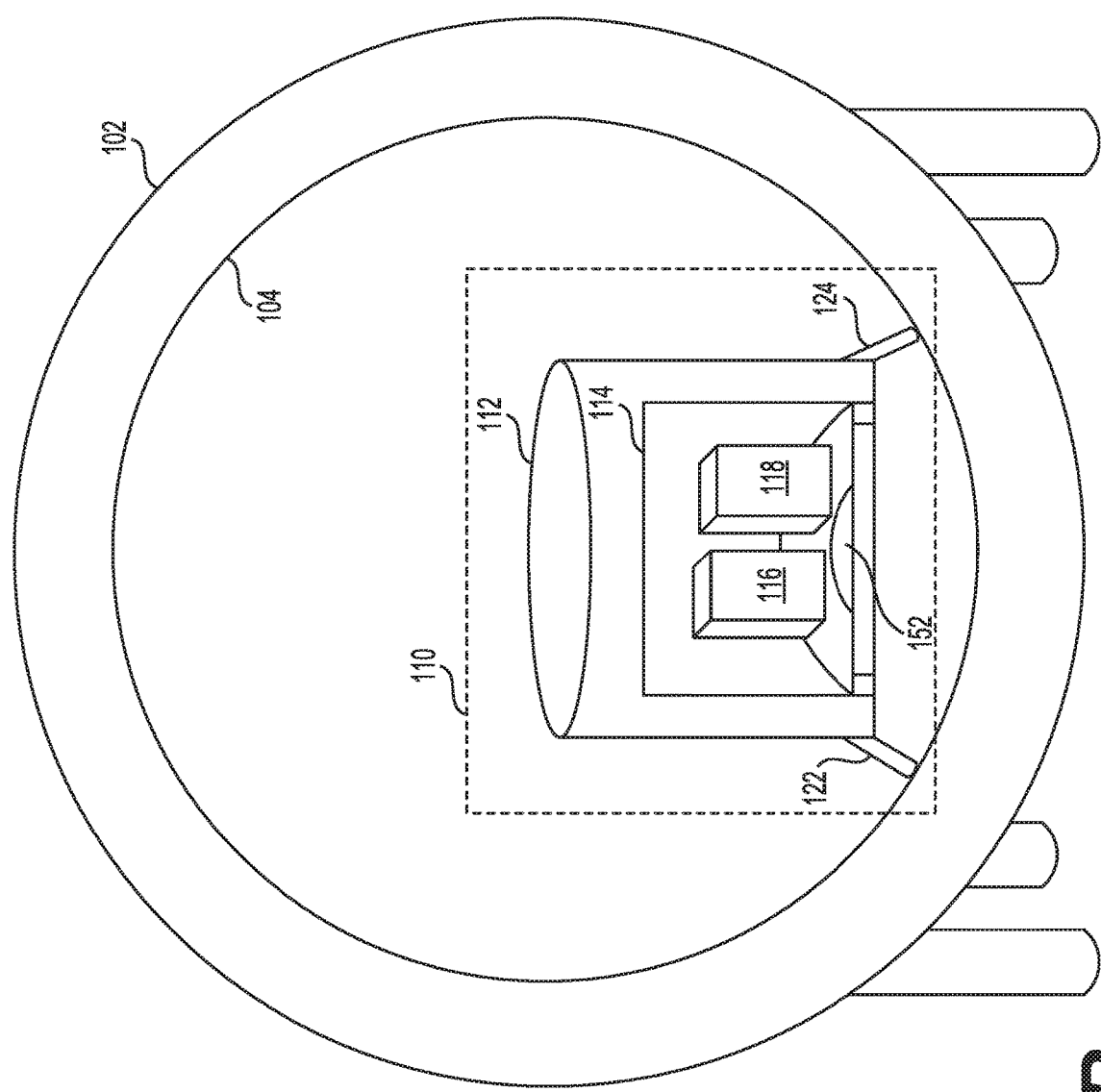
FIG. 1B shows another view of the superconducting computing system of FIG. 1A inside a liquid hydrogen environment, in accordance with one example.

With continued reference to Fla 1A, in this example, housing 112 may be configured as a cylindrical container arranged inside liquid hydrogen container 104 towards the bottom of liquid hydrogen container 104. In this example, housing 112 may be arranged inside liquid hydrogen container 104 on supports 122 and 124. Supports 122 and 124 may be configured to minimize contact with liquid hydrogen container 104 and thus minimize any thermal conduction through the supports. In the operating mode, liquid hydrogen would surround the cryogenic computing environment, with only the supports touching the inner surface of liquid hydrogen container 104. A retractable ring may drop out of housing 112 to seal off an "airlock" from the outside environment through which parts, robotics, new equipment, or the like could be passed for installation into housing 112. Airlock 120 could be either a full ring or it could be reduced to a smaller size to save cost and liquid Helium. In this example, airlock 120 is shown in an open position. The combination of the retractable ring and the airlock may function as a transfer system to allow access to housing 112. FIG. 1B shows another view 150 of the same superconducting computing system 110 as described with respect to FIG. 1A, and shows the liquid hydrogen environment described earlier. In FIG. 1B, however, airlock 120 is shown in its closed position 152. Although FIGS. 1A and 1B show superconducting computing system 110 as having a certain form and arrangement, superconducting computing system 110 may have a different form and arrangement. Similarly, although FIGS. 1A and 1B show the liquid hydrogen environment including a spherical storage container, liquid hydrogen container 104 may be of a different shape, including a cylindrical shape.

Figure 2:
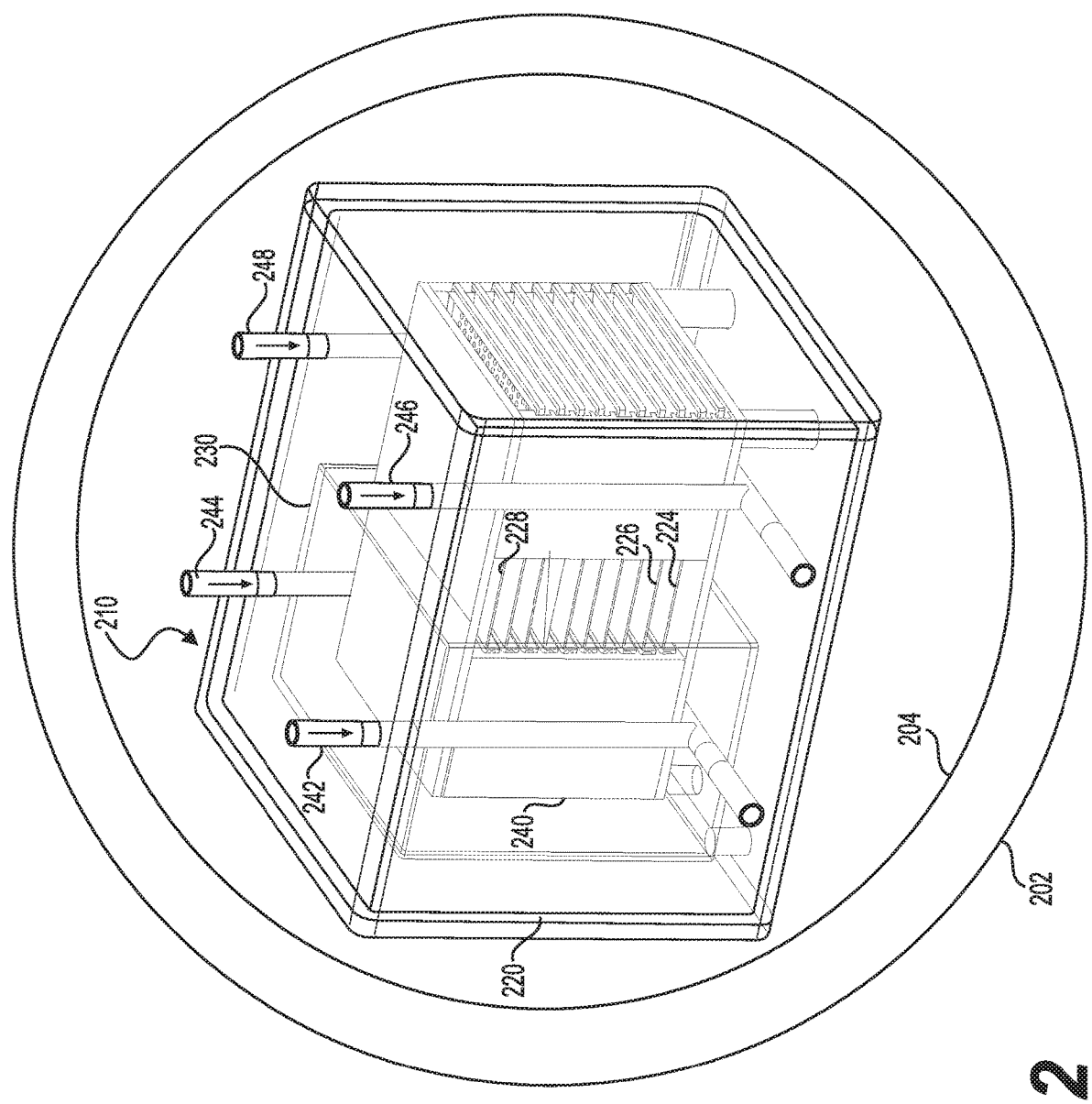
FIG. 2 shows a detailed view of a portion of the superconducting computing system of FIG. 1A in accordance with one example.

FIG. 2 shows a superconducting computing system 210 inside a liquid hydrogen environment 200, in accordance with one example. Like as shown in FIG. 1, liquid hydrogen environment 200 may include a storage tank 202 that may include a liquid hydrogen container 204. Superconducting computing system 210 may include a housing 220. Housing 220 may be configured to maintain a vacuum inside the housing. Thus, components (e.g., processors and memory) corresponding to superconducting computing system 210 are located inside housing 220 that maintains vacuum. Housing 220 may include one or more substrates (e.g., substrate 224, 226, and 228). Each of these substrates may be formed using glass or other suitable materials; for example, various types of polymers. In one example, the glass material may be borosilicate glass. Housing 220 may further include a thermal shield 230 that may be configured to thermally isolate portions of each of the substrates located inside thermal shield 230. Although not shown, thermal shield 230 may be cooled via liquid helium (or other appropriate coolant) flowing through pipes or tubes coupled to thermal shield 230. In one example, thermal shield 230 may be formed using a nickel-iron alloy (e.g., Mu-metal). Thermal shield 230 may further be wrapped into a multilayer insulation (not shown). This way thermal shield 230 may provide thermal isolation between the 4K space and the 20K liquid hydrogen environment surrounding housing 220. In one example, superconducting components (e.g., Central-Processing Units (CPUs), Graphics-Processing Units (CPUs); Artificial Intelligence Processors, Field-Programmable Gate Arrays (FPGAs); Application-Specific Integrated Circuits (ASICs), Application-Specific Standard Products (ASSPs), System-on-a-Chip systems (SOCs), Complex Programmable Logic Devices (CPLDs)) may be located on substrates (e.g., 224, 226, and 228). The superconducting components may be configured to provide any functionality that is required to implement a computing function or a storage function. As an example, without limitation, the computing functionality may include at least one of (or any appropriate combination of) a central-processing functionality, a graphics-processing functionality, an artificial-intelligence functionality, a gate-array functionality, a memory functionality, or a bus-interface-management functionality. Superconducting components may also provide storage functionality and may comprise memory components, including any of non-volatile or volatile memory components. Volatile memory components may include any of the various types of random-access memory components, including dynamic random-access memory (DRAM) components. Non-volatile memory components may include any of various types of memory components that can store information even when they are not powered, including flash-memory components. Superconducting components may further include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs)

With continued reference to FIG. 2, thermal shield 230 may help maintain a temperature that is suitable for allowing the superconducting devices to operate consistent with the superconductivity principles. Thus, superconducting components may be maintained at cryogenic temperatures (e.g., a few milli Kelvins to 4.2 Kelvin). This may be accomplished via the combination of thermal isolation and cooling via liquid helium or other such coolants. As an example, copper sidewalls 240 may be mounted adjacent to superconducting components. Copper sidewalls 240 may also be cooled via liquid helium flowing through pipes (e.g., pipes 242, 244, 246, and 248) as shown in FIG. 2. In one example, a system operating in a cryogenic environment may require a vacuum to operate properly. In one example, a vacuum may relate to a pressure in a range of $10^{-3}$ Torr to $10^{-10}$ Torr. It is to be recognized that the temperature ranges referred to herein relate to the temperature of the environment in which these components are operating and not the temperature of the components themselves. Thus, references such as "operating at" or "maintained at" refer to the temperature of the environment in which these components are operating or are being maintained inside.

With continued reference to FIG. 2, superconducting components may communicate with each other using circuit traces formed on the top or the bottom surface of each of the common substrates (e.g., 224, 226, and 228). The circuit traces may be formed using a suitable manufacturing process, including, but not limited to, selective laser sintering, fused deposition modeling, direct metal laser sintering, stereolithography, cladding, electron beam melting, electron beam direct manufacturing, aerosol jetting, ink jetting, semi-solid freeform fabrication, digital light processing, laminated object manufacturing, 3D printing, or other similar manufacturing processes. In one example, the circuit traces may be made of niobium (or another suitable superconducting material) in a region of the substrate that includes superconducting components. Although FIG. 2 shows a certain arrangement of components, substrates, and other component, these could be arranged in a different manner. In addition, fewer or additional components, substrates, and other components may be present.

Figure 3:
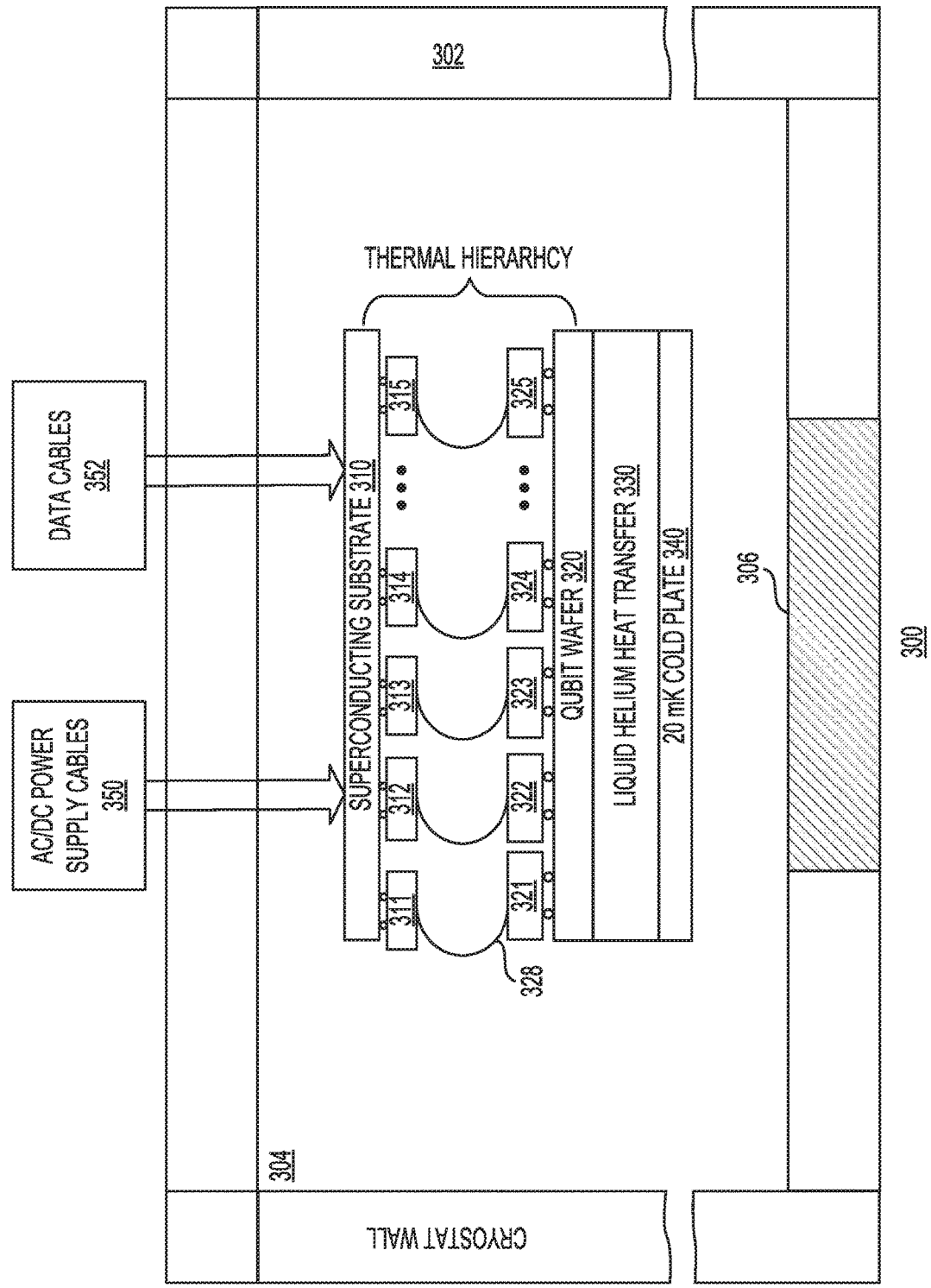
FIG. 3 shows a detailed view of a portion of the superconducting computing system of FIG. 1A in accordance with one example.

FIG. 3 shows a detailed view of a portion 300 of the superconducting computing system of FIG. 1 in accordance with one example. Portion 300 may include a cryostat wall 302 enclosing a cryo-computing environment (CCE) 304. Cryostat wall 302 may be used to isolate CCE 304 from the liquid hydrogen environment. Portion 306 of cryostat wall 302 may allow access to CCE 304. In this example, CCE 304 may include superconducting components arranged inside a vacuum. CCE 304 may include a superconducting substrate 310, qubit wafer 320, a liquid helium heat transfer 330, and a 20 mK cold plate 340. AC/DC power supply cables 350 may be used to provide AC and/or DC power to the superconducting components. Data cables 352 may be used to allow communication of microwave signals or other signals to/from the superconducting components in CCE 304.

Still referring to FIG. 3, in this example, the chips 321, 322, 323, 324, and 325 may be arranged as a 2-D array on (or near) the top face of a single monolithic wafer (e.g., qubit wafer 320) of silicon or sapphire. The 20 mK cold plate 340 may be thermally strapped to the mixing chamber (e.g., the hermetic helium (He) heat transfer bath) of a dilution refrigerator. Although not shown in FIG. 3, the thermal hierarchy may be maintained using the dilution refrigerator and cold plates or other thermal couplings. The dilution refrigerator may be a wet dilution refrigerator or a dry dilution refrigerator. As an example, a wet dilution refrigerator may use a combination of pumps and heat exchangers to generate different levels of temperature from 4.2 K to 20 mK. A circulating pump (not shown) may pump via a return line to circulate liquid Helium through the various stage of the dilution refrigerator. The liquid Helium may be a mixture of two isotopes (He-4 and He-3). Another pump may access liquid Helium from a reservoir and may collect any condensation formed as a result of the heat exchange with the circulating liquid Helium, Additional heat exchangers may be used to cool the circulating Helium to a temperature at which the liquid Helium may undergo a phase separation generating a concentrated phase and a diluted phase of the Helium. As these two phases may enter a mixing chamber (not shown), the concentrated phase may be diluted, creating additional cooling. As the cooled diluted Helium is circulated from the mixing chamber to a still, the cooled diluted Helium may be used to cool the downward (towards the mixing chamber) flowing Helium until it reaches the still. As the liquid Helium continues to be circulated the thermally coupled cold plates may be used to maintain the superconducting components and the qubit wafer at the desired cryogenic temperatures.

With continued reference to FIG. 3, some basic interface circuitry may reside on the qubit wafer itself; more complex interface circuitry may reside on chips 321, 322, 323, 324, and 325, which are flip-chip bonded (circuit face down) to qubit wafer 320. Cables (e.g., cable 328) may be routed through radiation shields to chips 311, 312, 313, 314, and 315 mounted on superconducting substrate 310. In this example, chips 311, 312, 313, 314, and 315 may operate at approximately 4.2 Kelvin, Cables (e.g., cable 328) may be thermally clamped, as needed, to maintain a thermal hierarchy, Although FIG. 3 shows a certain number of components arranged in a certain manner, there could be more or fewer number of components arranged differently.

In one example, the superconducting components may be formed to support signals ranging from DC to signals having a frequency that is greater than 10 GHz. In this example, the superconducting components may be fabricated over large silicon substrates such as 200 mm wafers, 300 mm wafers or even larger wafers, which may be separated into multiple dies. In one example, the substrate could be made from silicon or any other thermally insulating or conducting material. Also, in this example, signal traces and ground planes may be formed by sputtering niobium, or a similar superconducting material. As an example, compounds of niobium such as niobium nitride (NbN) or niobium titanium nitride (NbTiN) may also be used. Other physical vapor deposition (PVD) methods, such as molecular beam epitaxy (MBE), may also be used. Depending on the type of the material used for the traces, sputtering processes, chemical vapor deposition (CVD) processes, plasma enhanced chemical vapor deposition (PECVD) process, evaporation processes, or atomic layer deposition (ALD) processes may also be used. Thus, for example, the niobium compounds such as NbN and NbTiN may be formed using a CVD process.

Figure 4:
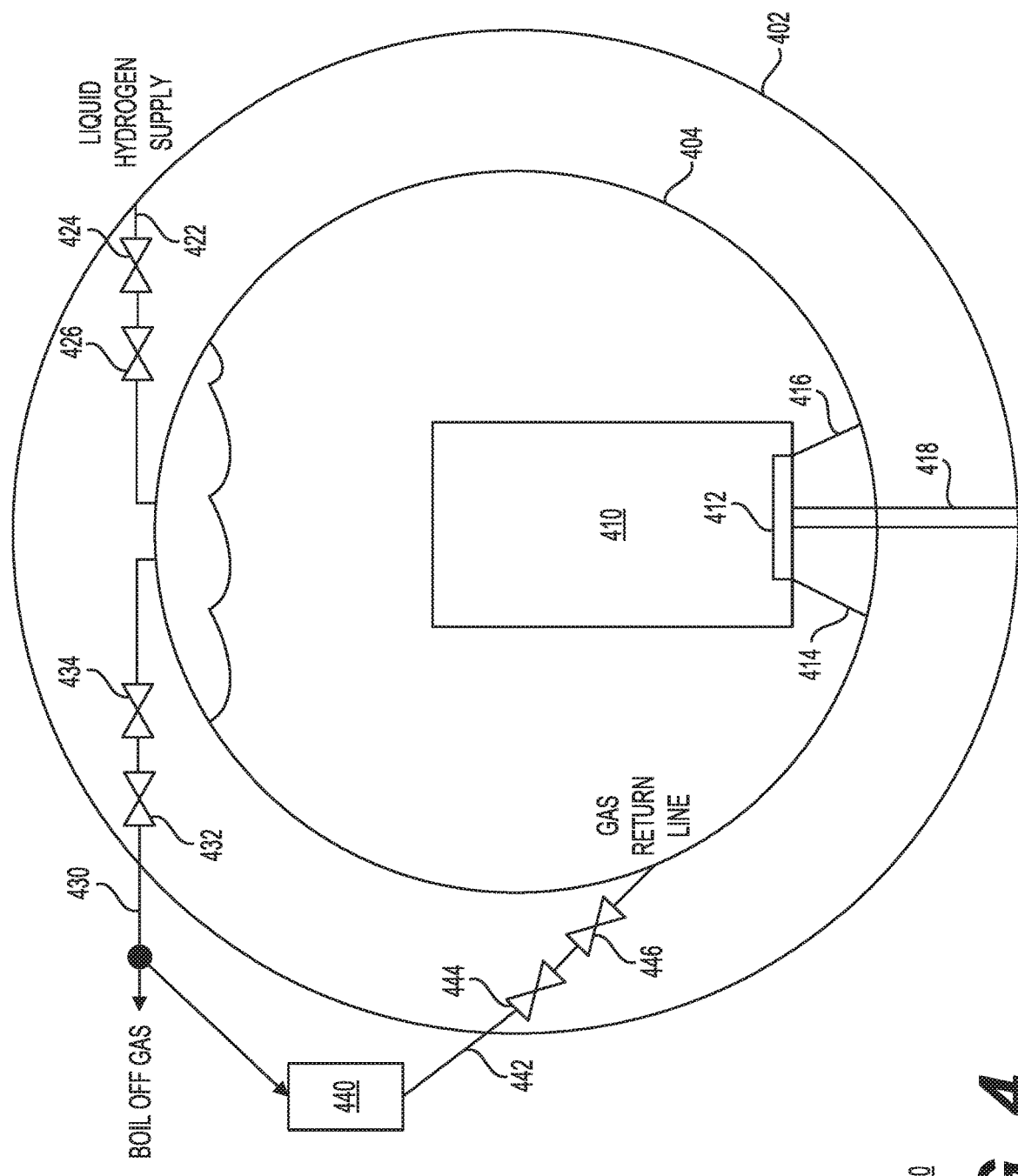
FIG. 4 shows a superconducting computing system inside a liquid hydrogen environment in accordance with one example.

FIG. 4 shows a superconducting computing system 410 inside a liquid hydrogen environment 400 in accordance with one example. Liquid hydrogen environment 400 may include a storage tank 402. Storage tank 402 may include a liquid hydrogen container 404. Liquid hydrogen container 404 may include superconducting computing system 410, including supports 414 and 416. Superconducting computing system 410 may also include an airlock 412, which may further be coupled to a set of cables 418. Superconducting computing system 410 may be like the superconducting computing systems described earlier. Liquid hydrogen supply may be provided a gas supply line 422. Valves 424 and 426 may be used to control and regulate the supply. Any boil-off gas formed due to boiling of liquid hydrogen may be removed from liquid hydrogen container 404 via boil-off gas discharge line 430. The discharge of the boil-off gas may be controlled and regulated using valves 432 and 434. If needed, some of the boil-off gas may be processed to generate liquified hydrogen using liquefier 440. The liquified hydrogen may be returned to liquid hydrogen container 404 via gas return line 442. The returning gas may be controlled and regulated via valves 444 and 446. Although FIG. 4 shows a certain shape and arrangement of the various components, they may have other shapes and they may be arranged differently.

In conclusion, in one aspect of the present disclosure, a superconducting computing system including a housing, arranged inside a liquid hydrogen environment, where a lower pressure is maintained inside the housing than a pressure outside the housing. The superconducting computing system may further include a substrate, arranged inside the housing, having a surface, where a plurality of components attached to the surface is configured to provide at least one of a computing or a storage functionality, and where the substrate further comprises a plurality of circuit traces for interconnecting at least a subset of the plurality of the components, where the housing is configured such that each of the plurality of components is configured to operate at a first temperature, where the first temperature is below 4.2 Kelvin, despite the liquid hydrogen environment having a second temperature greater than 4.2 Kelvin.

In the superconducting computing system, the lower pressure may be in range between $10^{-3}$ Torr to $10^{-10}$ Torr, and the second temperature may be in a range between 20 Kelvin and 24 Kelvin. The liquid hydrogen environment may include a structure comprising the liquid hydrogen, and the plurality of components may be cooled using at least one cold plate coupled to liquid helium.

The substrate may be accessible via a transfer system configured to allow access to the substrate. Each of the plurality of components may comprise at least one of a central processing unit, a graphics-processing unit, an artificial-intelligence processor, a field-programmable gate array, an application-specific integrated circuit, an application-specific standard product, a system-on-a-chip, a complex programmable logic device, a static random-access memory, a dynamic random-access memory, or a Josephson magnetic random-access memory.

The computing functionality may comprise at least one of a central-processing functionality, a graphics-processing functionality, an artificial-intelligence functionality, a gate-array functionality, a memory functionality, or a bus-interface-management functionality and where the storage functionality comprises at least one of a memory functionality, gate-array functionality, a memory controller functionality, or a bus-interface-management functionality. The substrate may include a plurality of circuit traces and each of the plurality of circuit traces may comprise a superconducting metal.

In another aspect of the present disclosure, a superconducting computing system including a housing, arranged inside a liquid hydrogen environment, where a lower pressure is maintained inside the housing than a pressure outside the housing, is provided. The superconducting computing system may further include a first substrate, inside the housing, arranged in a first plane having a first surface parallel to the first plane, where a first plurality of components, attached to the first surface, is configured to provide at least one of a computing or a storage functionality. The superconducting computing system may further include a second substrate, inside the housing, arranged in a second plane, parallel to the first plane, the second substrate having a second surface parallel to the second plane, where a second plurality of components, attached to the second surface, is configured to provide at least one of the computing functionality or the storage functionality, and where the first substrate further comprises a first plurality of circuit traces for interconnecting at least a subset of the first plurality of the components, and where the second substrate further comprises a second plurality of circuit traces for interconnecting at least a subset of the second plurality of the components, where liquid helium inside the housing is configured to cool the environment inside the housing such that each of the first plurality of components and the second plurality of components is configured to operate at a first temperature, where the first temperature is below 4.2 Kelvin, despite the liquid hydrogen environment having a second temperature greater than 4.2 Kelvin.

In the superconducting computing system, the lower pressure may be in range between $10^{-3}$ Torr to $10^{-10}$ Torr, and the second temperature may be in a range between 20 Kelvin and 24 Kelvin. The liquid hydrogen environment may include a structure comprising the liquid hydrogen, and the plurality of components may be cooled using at least one cold plate coupled to liquid helium.

Each of the first substrate and the second substrate may be accessible via a transfer system configured to allow access to each of the first substrate and the second substrate. Each of the first plurality of components and the second plurality of components may comprise at least one of a central processing unit, a graphics-processing unit, an artificial-intelligence processor, a field-programmable gate array, an application-specific integrated circuit, an application-specific standard product, a system-on-a-chip, a complex programmable logic device, a static random-access memory, a dynamic random-access memory, or a Josephson magnetic random-access memory.

The computing functionality may comprise at least one of a central-processing functionality, a graphics-processing functionality, an artificial-intelligence functionality, a gate-array functionality, a memory functionality, or a bus-interface-management functionality and where the storage functionality comprises at least one of a memory functionality, gate-array functionality, a memory controller functionality, or a bus-interface-management functionality. Each of the first plurality of circuit traces and the second plurality of circuit traces may comprise a superconducting metal.

In yet another aspect, the present disclosure relates to a superconducting computing system including a first storage tank. The superconducting computing system may further include a second storage tank containing hydrogen in a liquified state, where the second storage tank is arranged inside the first storage tank. The superconducting computing system may further include a cryostat wall, arranged inside the second storage tank, where a vacuum is maintained inside a space enclosed by the cryostat wall. The superconducting computing system may further include a substrate, inside the cryostat wall, where a plurality of components, coupled to the substrate, is configured to provide at least one of a computing or a storage functionality. The superconducting computing system may further include a cooling system configured to maintain a temperature inside the housing below 4.2 Kelvin.

The vacuum may correspond to a pressure in a range between $10^{-3}$ Torr to $10^{-10}$ Torr, and the hydrogen in the liquified state may be maintained at a second temperature in a range between 20 Kelvin and 24 Kelvin.

The substrate may be accessible via a transfer system configured to allow access to the substrate. Each of the plurality of components may comprise at least one of a central processing unit, a graphics-processing unit, an artificial-intelligence processor, a field-programmable gate array, an application-specific integrated circuit, an application-specific standard product, a system-on-a-chip, a complex programmable logic device, a static random-access memory, a dynamic random-access memory, or a Josephson magnetic random-access memory.

The computing functionality may comprise at least one of a central-processing functionality, a graphics-processing functionality, an artificial-intelligence functionality, a gate-array functionality, a memory functionality, or a bus-interface-management functionality and where the storage functionality comprises at least one of a memory functionality, gate-array functionality, a memory controller functionality, or a bus-interface-management functionality. The substrate may include a plurality of circuit traces and each of the plurality of circuit traces may comprise a superconducting metal.

It is to be understood that the methods, modules, and components depicted herein are merely exemplary. For example, and without limitation, illustrative types of superconducting devices may include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc.

In addition, in an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above-described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or an, as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A superconducting computing system comprising:
a housing, arranged inside a liquid hydrogen environment, wherein a lower pressure is maintained inside the housing than a pressure outside the housing, wherein the lower pressure is in a range between $10^{-3}$ Torr to $10^{-10}$ Torr, wherein the liquid hydrogen environment comprises a storage tank including a liquid hydrogen container having liquified hydrogen, and wherein the housing is arranged inside the liquid hydrogen container on a plurality of supports configured to reduce thermal conduction through the plurality of supports; and a plurality of superconducting components configured to provide at least one of a computing or a storage functionality, arranged inside the housing, wherein a first subset of the plurality of superconducting components comprises a first set of chips attached to a qubit wafer cooled using at least one cold plate coupled to liquid helium, wherein a second subset of each of the plurality of superconducting components comprises a second set of chips attached to a superconducting substrate, wherein the first subset of the plurality of superconducting components and the second subset of the plurality of superconducting components are coupled using thermally-clamped cables configured to maintain a thermal hierarchy, and wherein the housing is configured such that each of the first subset of the plurality of superconducting components and the second subset of the plurality of superconducting components is configured to operate at, or below, a first temperature, and wherein the first temperature is not greater than 4.2 Kelvin, despite the liquid hydrogen environment having a second temperature greater than 4.2 Kelvin.

2. The superconducting computing system of claim 1, wherein the second temperature is in a range between 20 Kelvin and 24 Kelvin.

3. The superconducting computing system of claim 1 further comprising a thermal shield configured to provide thermal isolation between any of the plurality of superconducting components arranged inside the housing and the liquid hydrogen environment.

4. The superconducting computing system of claim 1, wherein each of the plurality of superconducting components comprises at least one of a central processing unit, a graphics-processing unit, an artificial-intelligence processor, a field-programmable gate array, an application-specific integrated circuit, an application-specific standard product, a system-on-a-chip, a complex programmable logic device, a static random-access memory, a dynamic random-access memory, or a Josephson magnetic random-access memory.

5. The superconducting computing system of claim 1, wherein the computing functionality comprises at least one of a central-processing functionality, a graphics-processing functionality, an artificial-intelligence functionality, a gate-array functionality, a memory functionality, or a bus-interface-management functionality and wherein the storage functionality comprises at least one of a memory functionality, a gate-array functionality, a memory controller functionality, or a bus-interface-management functionality.

6. The superconducting computing system of claim 1, wherein the inside of the housing is accessible via a transfer system.

7. The superconducting computing system of claim 6, wherein the transfer system comprises an airlock.

8. A superconducting computing system comprising:
a housing, arranged inside a liquid hydrogen environment, wherein a lower pressure is maintained inside the housing than a pressure outside the housing, wherein the lower pressure is in a range between $10^{-3}$ Torr to $10^{-1}$ Torr, wherein the liquid hydrogen environment comprises a storage tank including a liquid hydrogen container having liquified hydrogen, and wherein the housing is arranged inside the liquid hydrogen container on a plurality of supports configured to reduce thermal conduction through the plurality of supports;

a plurality of superconducting components, formed on a substrate, configured to provide at least one of a computing or a storage functionality, arranged inside the housing, wherein a first subset of the plurality of superconducting components comprises a first set of chips attached to a qubit wafer cooled using at least one cold plate coupled to liquid helium, wherein a second subset of each of the plurality of superconducting components comprises a second set of chips attached to a superconducting substrate, wherein the first subset of the plurality of superconducting components and the second subset of the plurality of superconducting components are coupled using thermally-clamped cables configured to maintain a thermal hierarchy, and wherein the housing is configured such that each of the plurality of superconducting components is configured to operate at a first temperature, and wherein the first temperature is not greater than 4.2 Kelvin, despite the liquid hydrogen environment having a second temperature greater than 4.2 Kelvin; and a thermal shield configured to provide thermal isolation between any of the plurality of superconducting components arranged inside the housing and the liquid hydrogen environment.

9. The superconducting computing system of claim 8, wherein the second temperature is in a range between 20 Kelvin and 24 Kelvin.

10. The superconducting computing system of claim 7, wherein each of the plurality of superconducting components comprises at least one of a central processing unit, a graphics-processing unit, an artificial-intelligence processor, a field-programmable gate array, an application-specific integrated circuit, an application-specific standard product, a system-on-a-chip, a complex programmable logic device, a static random-access memory, a dynamic random-access memory, or a Josephson magnetic random-access memory.

11. The superconducting computing system of claim 8, wherein the computing functionality comprises at least one of a central-processing functionality, a graphics-processing functionality, an artificial-intelligence functionality, a gate-array functionality, a memory functionality, or a bus-interface-management functionality and wherein the storage functionality comprises at least one of a memory functionality, a gate-array functionality, a memory controller functionality, or a bus-interface-management functionality.

12. The superconducting computing system of claim 8, wherein the inside of the housing is accessible via a transfer system.

13. The superconducting computing system of claim 12, wherein the transfer system comprises an airlock.

14. A superconducting computing system comprising:
a first storage tank;
a second storage tank containing hydrogen in a liquified state, wherein the second storage tank is arranged inside the first storage tank;
a supply line for supplying hydrogen to the second storage tank;
a boil-off gas discharge line for removing boil-off gas from the second storage tank;
a cryostat wall, arranged inside the second storage tank, wherein a
vacuum is maintained inside a space enclosed by the cryostat wall, wherein the vacuum corresponds to a pressure in a range between $10^{-3}$ Torr to $10^{-1}$ Torr, wherein the space enclosed by the cryostat wall is arranged inside the second storage tank on a plurality of supports configured to reduce thermal conduction through the plurality of supports;

a plurality of superconducting components, arranged inside the cryostat wall, configured to provide at least one of a computing or a storage functionality, wherein a first subset of the plurality of superconducting components comprises a first set of chips attached to a qubit wafer cooled using at least one cold plate coupled to liquid helium, wherein a second subset of each of the plurality of superconducting components comprises a second set of chips attached to a superconducting substrate, wherein the first subset of the plurality of superconducting components and the second subset of the plurality of superconducting components are coupled using thermally-clamped cables configured to maintain a thermal hierarchy; and a cooling system configured to maintain a temperature inside the cryostat wall not greater than 4.2 Kelvin.

15. The superconducting computing system of claim 14, wherein the hydrogen in the liquified state is maintained at a second temperature in a range between 20 Kelvin and 24 Kelvin.

16. The superconducting computing system of claim 14, wherein each of the plurality of superconducting components comprises at least one of a central processing unit, a graphics-processing unit, an artificial-intelligence processor, a field-programmable gate array, an application-specific integrated circuit, an application-specific standard product, a system-on-a-chip, a complex programmable logic device, a static random-access memory, a dynamic random-access memory, or a Josephson magnetic random-access memory.

17. The superconducting computing system of claim 14, wherein the computing functionality comprises at least one of a central-processing functionality, a graphics-processing functionality, an artificial-intelligence functionality, a gate-array functionality, a memory functionality, or a bus-interface-management functionality and wherein the storage functionality comprises at least one of a memory functionality, a gate-array functionality, a memory controller functionality, or a bus-interface-management functionality.

18. The superconducting computing system of claim 14, wherein the qubit wafer includes quantum information processing components.

* * * * *